United States Patent
Lo et al.

(10) Patent No.: US 7,875,198 B2
(45) Date of Patent: Jan. 25, 2011

(54) METHOD OF DERIVING ETCHING CORRECTION VALUES FOR PATTERNS OF PHOTOMASK AND METHOD OF FABRICATING PHOTOMASK

(75) Inventors: Chao-Lung Lo, Hsinchu (TW); Sunwook Jung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 883 days.

(21) Appl. No.: 11/556,843

(22) Filed: Nov. 6, 2006

(65) Prior Publication Data

US 2008/0124632 A1    May 29, 2008

(51) Int. Cl.
*B44C 1/22* (2006.01)
*G03F 1/00* (2006.01)

(52) U.S. Cl. .............................. 216/59; 216/41; 216/60; 216/84; 430/5

(58) Field of Classification Search .................. 216/41, 216/59, 60, 84; 430/5
See application file for complete search history.

(56) References Cited

U.S. PATENT DOCUMENTS

| | | | |
|---|---|---|---|
| 6,395,438 B1 | 5/2002 | Bruce et al. | |
| 6,486,492 B1 * | 11/2002 | Su | ................................ 257/48 |
| 6,684,382 B2 | 1/2004 | Liu | |
| 2004/0038139 A1 * | 2/2004 | Mui et al. | ....................... 430/30 |
| 2007/0134921 A1 * | 6/2007 | Tian et al. | .................... 438/689 |

* cited by examiner

*Primary Examiner*—Shamim Ahmed
(74) *Attorney, Agent, or Firm*—J.C. Patents

(57) ABSTRACT

A method of deriving etching correction values for the patterns of a photomask and a method of fabricating a photomask are described. The former method includes the following steps. The layout data of the photomask are provided, and local etching correction values of respective patterns are determined from the pattern configurations at respective areas of the photomask. A global etching correction value is determined from a wafer coverage ratio calculated mainly from the layout data. The local etching correction values of the respective patterns are added with the global etching correction value to obtain total etching correction values of the respective patterns. In the method of fabricating a photomask, the layout data are subjected to an etching correction based on the total etching correction values of the respective patterns and then to an optical proximity correction, and the photomask patterns are formed based on the resulting layout data.

17 Claims, 2 Drawing Sheets

METHOD OF DERIVING ETCHING CORRECTION VALUES FOR PATTERNS OF PHOTOMASK AND METHOD OF FABRICATING PHOTOMASK

BACKGROUND OF THE INVENTION

1. Field of the Invention

This invention relates to a fabricating process of a photomask used in an IC process applied to semiconductor wafers. More particularly, this invention relates to a method of deriving the etching correction values for the patterns of a photomask that may utilize a photomask with a specially designed pattern layout, and to a method of fabricating a photomask based on the same. This invention adds a global etching correction value in deriving etching correction values, so as to improve the accuracy of the etching correction values.

2. Description of the Related Art

As the linewidth of IC fabrication is continuously reduced, critical dimension (CD) control is more and more important to an IC process. Generally, the factors most affecting the CD of a wafer film are the lithography process and the etching process for patterning the wafer film. The CD of the patterned photoresist layer obtained with the lithography process is called an after-development critical dimension (DCD). The CD of the pattern film obtained with the etching process using the patterned photoresist layer as a mask is called an after-etching critical dimension (ECD).

When two patterns are proximal to each other, the DCD thereof is deviated due to optical proximity effect. Hence, after the layout data of the patterns of a photomask is provided, an optical proximity correction (OPC) procedure is often needed to reduce the deviation in the DCD. On the other hand, because in an etching process the local etchant consumption over the wafer depends on the local photoresist coverage ratio, deviation of ECD from DCD in a local area depends on the local pattern configuration. This is namely the micro-loading effect. Hence, in the design stage of a photomask, an etching correction is usually made according to the local pattern configurations before the OPC is made, as described in U.S. Pat. No. 6,684,382.

However, it is discovered in real practice that even an etching correction is made according to the local pattern configurations before the OPC is made, the ECD finally obtained still deviates from the predetermined critical dimension to a certain extent.

SUMMARY OF THE INVENTION

In view of the foregoing, this invention provides a method of improving the accuracy of the etching correction values for the patterns of a photomask, which adds a global etching correction value in deriving the etching correction values. The global etching correction value is determined from a wafer coverage ratio defined later, and the correlation information for the determination may be obtained with a photomask having a specially designed pattern layout capable of making different wafer coverage ratios.

This invention also provides a method of deriving the etching correction values for the patterns of a photomask, which is based on the above method of this invention.

This invention also provides a method of fabricating a photomask applied to a fabricating process of a semiconductor wafer, which makes an etching correction to the layout data of a photomask based on the etching correction values derived with the above method of this invention.

It is particularly noted that in this invention, the term "wafer coverage ratio" is defined as a ratio of the total area of the portions of the wafer covered by the photoresist to the area of the whole wafer, and the term "open ratio" is defined as the ratio of the total area of the pattern-free portions of a photomask (or a region of a photomask) to the area of the whole photomask (or the whole region of the photomask). In addition, the etching correction values determined from local pattern configurations as in the prior art are called local etching correction values.

The method of deriving etching correction values for the patterns of a photomask of this invention is described below. The layout data of the photomask are provided, and local etching correction values of respective patterns are determined from pattern configurations at respective areas of the photomask. A global etching correction value is determined from a wafer coverage ratio calculated mainly from the layout data. The local etching correction values of respective patterns are added with the global etching correction value to obtain total etching correction values of the respective patterns.

The method of fabricating a photomask of this invention is described as follows. The layout data of the photomask are provided. An etching correction is made to the layout data based on a database of etching correction values, wherein the database contains data of local etching correction values and data of global etching correction values for different wafer coverage ratios, and a total etching correction value of a pattern of the photomask is the sum of the local etching correction value of the pattern and a global etching correction value. The global etching correction value is determined from a wafer coverage ratio of the patterning process that is calculated mainly from the layout data. An optical proximity correction is made to the layout data with the etching correction. The patterns of the photomask are then formed based on the layout data with the etching correction and the optical proximity correction.

In some embodiments of the above methods, determination of the local etching correction values from the pattern configurations is based on experiences or based on correction rules and/or correction models.

In some embodiments, determination of the global etching correction value from the wafer coverage ratio is based on a result of precedent experiments. The result of precedent experiments may include a correlation table of global etching correction value to wafer coverage ratio. Making the correlation table may include the following steps. One or more photomasks with a critical dimension of the patterning process are used to form photoresist layers on multiple wafers in different wafer coverage ratios, wherein the wafers have been formed with a target layer to be defined thereon. The critical dimension (DCD) of the photoresist layer is measured for each wafer. The target layer on each wafer is etched and patterned using the photoresist layer thereon as a mask, and then the critical dimension (ECD) of the target layer is measured for each wafer. The (DCD-ECD) value is calculated for each wafer, and the (DCD-ECD) values of the wafers are tabled with respect to the different wafer coverage ratios of the wafers to obtain the correlation table. As only one photomask is used to make the correlation table, the photomask may include multiple regions with the same critical dimension of the patterning process but different open ratios, and the regions are selectively screened in use to make the different wafer coverage ratios. As multiple photomasks are used to make the correlation table, the photomasks have the same critical dimension, but have different open ratios to make the different wafer coverage ratios.

By adding a global etching correction value in deriving the etching correction values, the accuracy of the resulting etching correction values can be improved so that the ECD obtained finally is closer to the predetermined critical dimension.

It is to be understood that both the foregoing general description and the following detailed description are exemplary, and are intended to provide further explanation of the invention as claimed.

DESCRIPTION OF THE PREFERRED EMBODIMENTS

Figure 1:
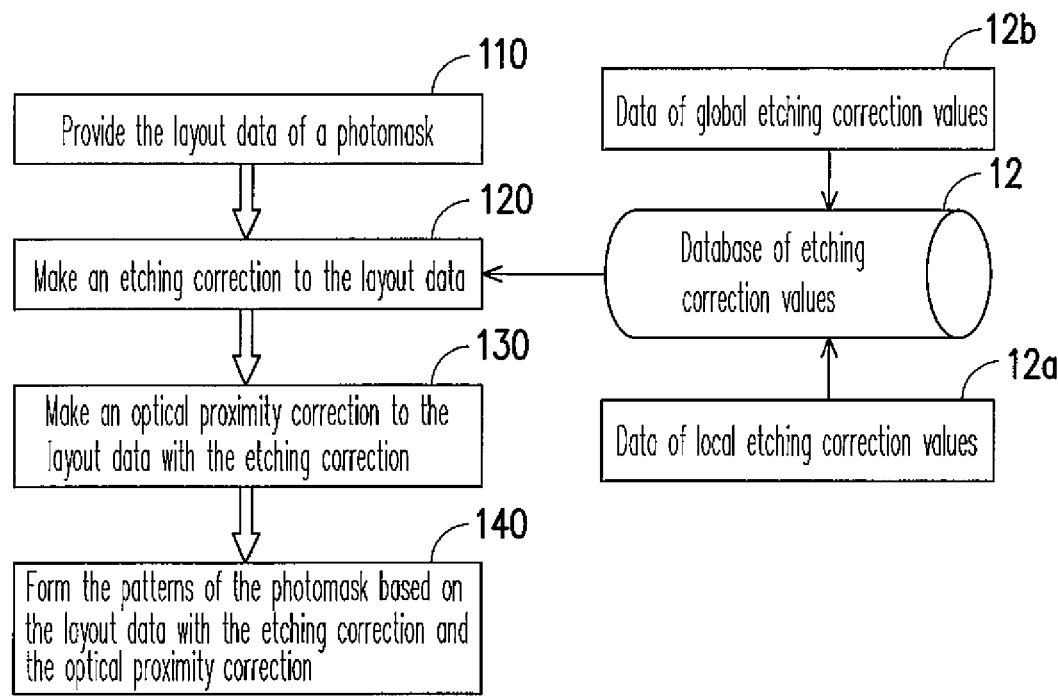
FIG. 1 shows a process flow of fabricating a photomask according to a preferred embodiment of this invention.

FIG. 1 shows a process flow of fabricating a photomask according to a preferred embodiment of this invention, wherein the photomask is applied to a fabricating process of a semiconductor wafer. The layout data of the photomask to be fabricated are provided in Step 110. In general, the layout data are provided from an IC designer and have not been subjected to any correction required for an IC fabricating process. Next, an etching correction is made to the layout data in Step 120 based on a database 12 of etching correction values, which contains data 12a of local etching correction values for different local pattern configurations and data 12b of global etching correction values 12b for different wafer coverage ratios. A total etching correction value of a pattern of the photomask is the sum of the local etching correction value of the pattern and a global etching correction value that is determined from a wafer coverage ratio of the patterning process calculated mainly from the layout data. The detailed determination/calculation steps are explained later with an example.

Then, an optical proximity correction (OPC) is made to the layout data with the etching correction in Step 130, wherein the OPC may include addition of hammerheads, serifs and assist lines to the patterns. The patterns of the photomask are then formed based on the layout data with the above etching correction and the OPC in Step 140.

The data 12a of local etching correction values for different local pattern configurations may include data of experience values, or include correction rules and/or correction models, as described in U.S. Pat. No. 6,684,382. A case using correction rules only needs no calculation, thus being easier to a case using correction models only, while simultaneously using correction rules and correction models makes certain merits. Taking a 130 nm process as an example, the correction rules thereof may include setting the local etching correction value as 5 nm when the distance "S" between two patterns satisfies "120 nm$\leq$S<250 nm", as −15 nm when "251 nm$\leq$S<700 nm" is satisfied, and as −25 nm when "701 nm$\leq$S" is satisfied.

Meanwhile, the data 12b of global etching correction values for different wafer coverage rations may include a result of precedent experiments that may be expressed as a correlation table of global etching correction values to wafer coverage ratio, which may be made as follows. One or more photomasks with a critical dimension of the patterning process as well as a specially designed pattern layout capable of making different wafer coverage ratios are used to form photoresist layers on multiple wafers in different wafer coverage ratios, wherein each of the wafers have been formed with a target layer to be defined thereon. The critical dimension (DCD) of the photoresist layer is then measured for each wafer. The target layer on each wafer is etched and patterned using the photoresist layer thereon as a mask, and then the critical dimension (ECD) of the target layer is measured for each wafer. The (DCD-ECD) value is calculated for each wafer, and the (DCD-ECD) values of the wafers are tabled with respect to the different wafer coverage ratios of the wafers, thus obtaining the correlation table. The above steps are further explained later with an example.

As multiple photomasks are used to make the correlation table, the photomasks have the same critical dimension of the patterning process but different open ratios. Since the pattern-free parts (open parts) of the photomask correspond to the photoresist-free parts of one shot, the photoresist coverage ratio in each shot is equal to "1-open ratio". Different wafer coverage ratios are thus made with the multiple photomasks of different open ratios.

As only one photomask is used to make the correlation table, the photomask may include multiple regions with the same critical dimension of the patterning process but different open ratios, while the regions are selectively screened in use to make different wafer coverage ratios. On each of the multiple photomasks, or on each of the multiple regions of the only one photomask, multiple patterns with the predetermined CD and the same peripheral pattern configuration are formed in a sufficient number facilitating the analyses for DCD and ECD, while the same pattern configuration eliminates the affect of the micro-loading effect to the CD analyses. The other patterns formed on each photomask or on each region of the only one photomask used make the same have the predetermined open ratio. An example of this invention using only one photomask to make the correlation table is described below.

Figure 2:
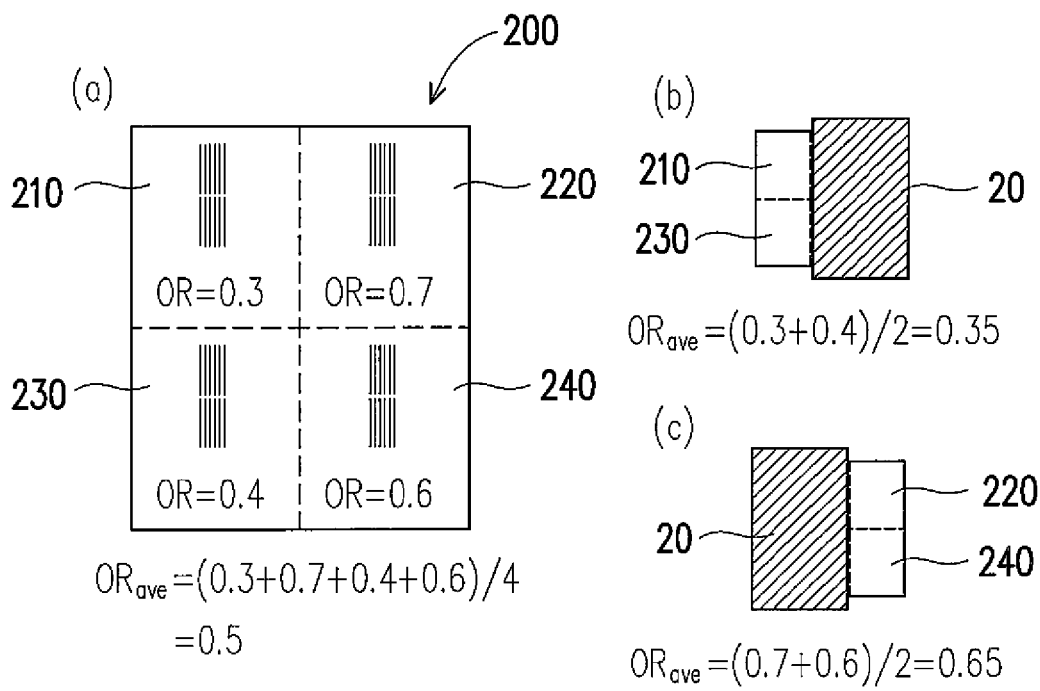
FIG. 2 schematically depicts a single photomask for making a correlation table of global etching correction value to wafer coverage ratio and the use thereof according to an example of this invention.

FIG. 2 schematically depicts a single photomask for making a correlation table of global etching correction value to wafer coverage ratio and the use thereof according to the example. The photomask 200 includes four regions 210, 220, 230 and 240 with the same CD hut different open ratios, 0.3, 0.7, 0.4 and 0.6, respectively. When the whole photomask 200 is exposed, as shown in FIG. 2(a), the average open ratio "$OR_{ave}$" is equal to 0.5 [=(0.3+0.7+0.4+0.6)/4]. When a screen board 20 is used to screen the regions 220 and 240 at the right half exposing the regions 210 and 230 at the left half, as shown in FIG. 2(b), the average open ratio is equal to 0.35 [=(0.3+0.4)/2]. When the screen board 20 is used to screen the regions 210 and 230 at the left half exposing the regions 220 and 240 at the right half, as shown in FIG. 2(c), the average open ratio is equal to 0.65 [=(0.6+0.7)/2].

Figure 3:
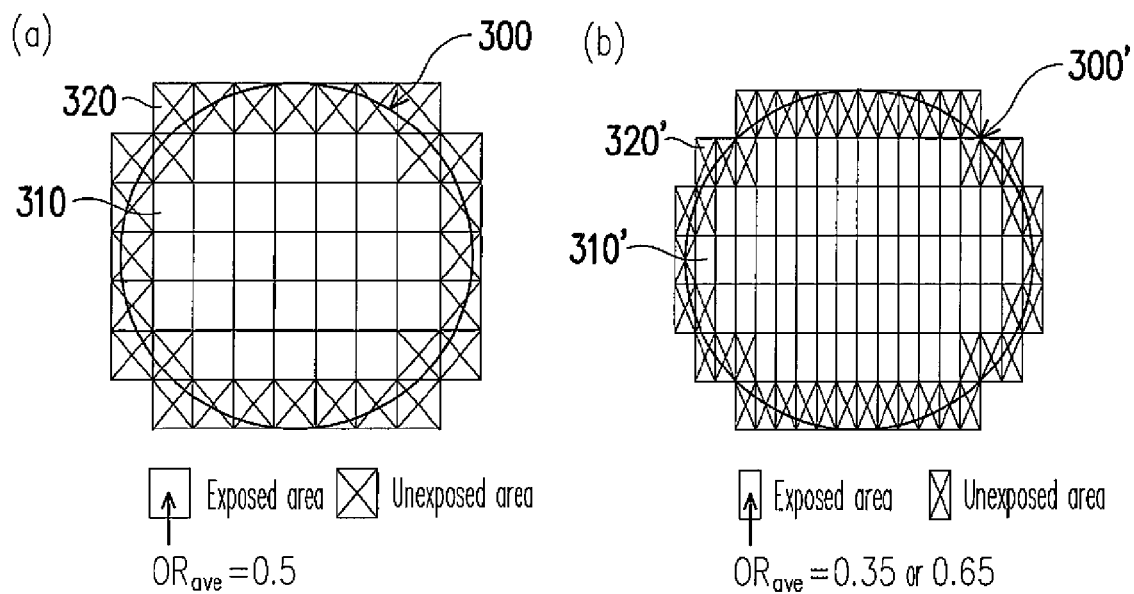
FIG. 3 schematically depicts the use of the single photomask in FIG. 2 in forming multiple wafers with different wafer coverage ratios according to the example.

FIG. 3 schematically depicts the use of the single photomask in FIG. 2 in forming multiple wafers with different wafer coverage ratios, wherein the whole photomask 200 is exposed as in (a) and the right or left half of the photomask 200 is exposed as in (b). In this example, the radius of the wafers 300/300' is about 100 mm. When the whole photomask 200 is exposed, 31 shots 310 each having dimensions of about 26×32 mm² are formed. When the right or left half the photomask 200 is exposed, 64 shots 310' each having dimensions of about 13×32 mm² are formed. The calculation of the wafer coverage ratio is explained below with the case exposing the whole photomask 200 as an example. The photoresist material in the unexposed regions is not removed in the development and covers an area of ($\pi \times 100^2 - 26 \times 32 \times 31$). The average open ratio in each shot (exposed region) is 0.5, so that the photoresist material in the exposed regions covers an area of $26 \times 32 \times 31 \times (1-0.5)$. The sum of the two areas is calculated and then divided by the area ($\pi \times 100^2$) of the whole wafer to obtain a wafer coverage ratio of about 0.59. With the same calculation steps, the wafer coverage ratios corresponding to the average open ratios of 0.35 and 0.65 are obtained as 0.7 and 0.45, respectively, as the left or right half of the photomask 200 is exposed.

Figure 4:
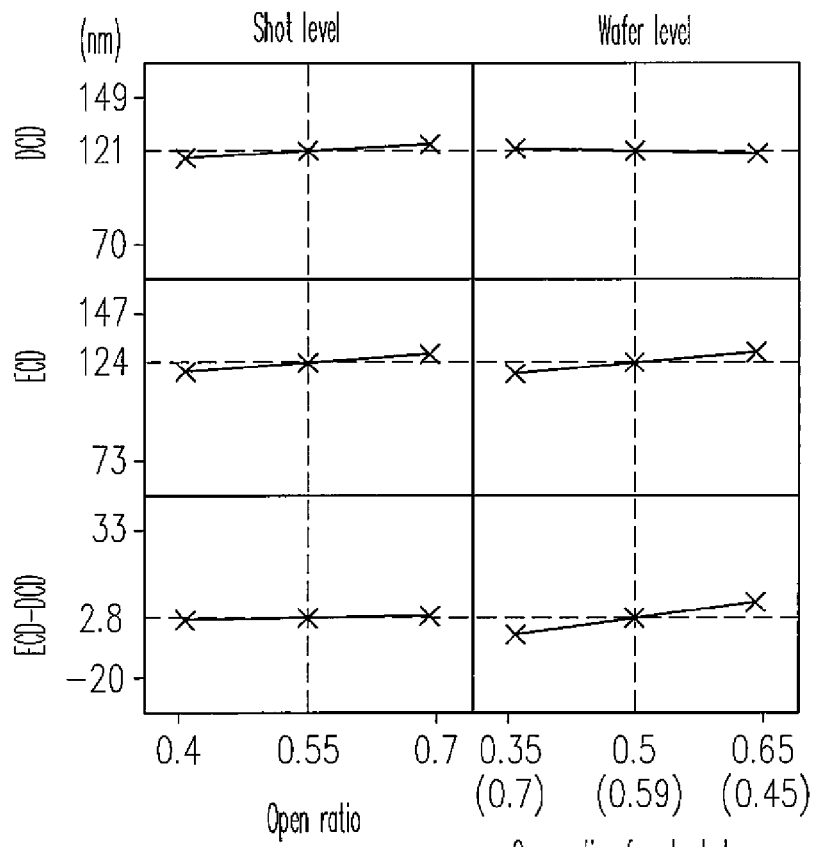
FIG. 4 plots respective variations of the DCD, the ECD and their difference with the wafer coverage ratio in the wafer level (right half) according to the example of this invention as well as respective variations of the DCD, the ECD and their difference with the open ratio in the shot level (left half).

FIG. 4 plots respective variations of the DCD, the ECD and their difference with the wafer coverage ratio in the wafer level (right half) according to the example of this invention as well as respective variations of the DCD, the ECD and their difference with the open ratio in the shot level (left half). In the shot-level experiments, there is only one shot formed on a wafer so that the wafer coverage ratio can be considered as a constant that is close to one.

As indicated by the left half of FIG. 4, when the wafer coverage ratio is fixed, the CD deviation caused by the etching, which is equal to (ECD-DCD), hardly varies with the shot-level open ratio. As indicated by the right half of FIG. 4, however, the (ECD-DCD) value changes remarkably as the wafer coverage ratio is changed, which proves that the wafer coverage ratio truly affect the critical dimension in the etching. Since the (ECD-DCD) value is the CD deviation cause by the etching, the inverse of the same is the global etching correction value required. Specifically, since the wafer coverage ratios 0.45, 0.59 and 0.7 respectively correspond to (ECD-DCD) values of 7, 2.8 and −2, the corresponding global etching correction values are respectively −7, −2.8 and +2 (=DCD-ECD). Accordingly, a correlation table of global etching correction value to wafer coverage ratio is obtained.

In summary, this invention adds a global etching correction value in deriving the etching correction values except considering the local etching correction values. By doing so, the accuracy of the resulting etching correction values can be improved so that the ECD obtained finally is closer to the predetermined critical dimension.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of deriving etching correction values for patterns of a photomask that is used in a patterning process of a wafer, comprising:
    providing layout data of the photomask;
    determining local etching correction values of respective patterns of the photomask from pattern configurations at respective areas of the photomask;
    determining a global etching correction value from a wafer coverage ratio in the patterning process that is calculated mainly from the layout data, wherein the wafer coverage ratio is defined as a ratio of a total area of portions of the wafer to be covered by a photoresist defined by the photomask to an area of the whole wafer; and
    adding the local etching correction values of the respective patterns with the global etching correction value to obtain total etching correction values of respective patterns.

2. The method of claim 1, wherein the local etching correction values of the respective patterns are determined from the pattern configurations based on experiences or based on correction rules and/or correction models.

3. The method of claim 1, wherein the global etching correction value is determined from the wafer coverage ratio based on a result of precedent experiments.

4. The method of claim 3, wherein the result of the precedent experiments includes a correlation table of global etching correction value to wafer coverage ratio, and making the correlation table comprises steps of:
    using one or more photomasks with a critical dimension of the patterning process to form photoresist layers on a plurality of wafers in different wafer coverage ratios, the wafers having been formed with a target layer to be defined thereon;
    measuring an after-development critical dimension (DCD) of the photoresist layer for each wafer;
    etching and patterning the target layer on each wafer using the photoresist layer thereon as a mask;
    measuring an after-etching critical dimension (ECD) of the target layer for each wafer;
    calculating a (DCD-ECD) value for each wafer by subtracting the value of the ECD from the value of the DCD; and
    tabling the (DCD-ECD) values of the wafers with respect to the different wafer coverage ratios of the wafers.

5. The method of claim 4, wherein only one photomask is used to produce the correlation table, the only one photomask including a plurality of regions with the same critical dimension but different open ratios and the regions being selectively screened in use to make the different wafer coverage ratios.

6. The method of claim 4, wherein a plurality of photomasks having the same critical dimension but different open ratios are used to produce the correlation table.

7. A method of fabricating a photomask that is used in a patterning process of a wafer, comprising:
    providing layout data of the photomask;
    making an etching correction to the layout data based on a database of etching correction values, wherein the database contains data of local etching correction values and data of global etching correction values for different wafer coverage ratios, a total etching correction value of a pattern of the photomask is the sum of the local etching correction value of the pattern and a global etching correction value, the global etching correction value is determined from a wafer coverage ratio of the patterning process that is calculated mainly from the layout data, and the wafer coverage ratio is defined as a ratio of a total area of portions of the wafer to be covered by a photoresist defined by the photomask to an area of the whole wafer;
    making an optical proximity correction (OPC) to the layout data with the etching correction; and
    forming the patterns of the photomask based on the layout data with the etching correction and the optical proximity correction.

8. The method of claim 7, wherein the data of local etching correction values comprise a plurality of experience values, or correction rules and/or correction models.

9. The method of claim 7, wherein the data of global etching correction values comprise a result of precedent experiments.

10. The method of claim 9, wherein the result of the precedent experiments comprises a correlation table of global etching correction value to wafer coverage ratio, and making the correlation table comprises steps of:

using one or more photomasks with a critical dimension of the patterning process to form photoresist layers on a plurality of wafers in different wafer coverage ratios, the wafers having been formed with a target layer to be defined thereon;

measuring an after-development critical dimension (DCD) of the photoresist layer for each wafer;

etching and patterning the target layer on each wafer using the photoresist layer thereon as a mask;

measuring an after-etching critical dimension (ECD) of the target layer for each wafer;

calculating a (DCD-ECD) value for each wafer by subtracting the value of the ECD from the value of the DCD; and tabling the (DCD-ECD) values of the wafers with respect to the different wafer coverage ratios of the wafers.

11. The method of claim 10, wherein only one photomask is used to produce the correlation table, the only one photomask including a plurality of regions with the same critical dimension but different open ratios and the regions being selectively screened in use to make the different wafer coverage ratios.

12. The method of claim 10, wherein a plurality of photomasks having the same critical dimension but different open ratios are used to produce the correlation table.

13. A method of improving the accuracy of etching correction values for patterns of a photomask used in a patterning process of a wafer, comprising incorporating a global etching correction value in each of the etching correction values in deriving the etching correction values, wherein the global etching correction value is determined from a wafer coverage ratio in the patterning process, and the wafer coverage ratio is defined as a ratio of a total area of portions of the wafer to be covered by a photoresist defined by the photomask to an area of the whole wafer.

14. The method of claim 13, wherein the global etching correction value is determined from the wafer coverage ratio based on a result of precedent experiments.

15. The method of claim 14, wherein the result of precedent experiments comprises a correlation table of global etching correction value to wafer coverage ratio, and making the correlation table comprises steps of:

using one or more photomasks with a critical dimension of the patterning process to form photoresist layers on a plurality of wafers in different wafer coverage ratios, the wafers having been formed with a target layer to be defined thereon;

measuring an after-development critical dimension (DCD) of the photoresist layer for each wafer;

etching and patterning the target layer on each wafer using the photoresist layer thereon as a mask;

measuring an after-etching critical dimension (ECD) of the target layer for each wafer;

calculating a (DCD-ECD) value for each wafer by subtracting the value of the ECD from the value of the DCD; and tabling the (DCD-ECD) values of the wafers with respect to the different wafer coverage ratios of the wafers.

16. The method of claim 15, wherein only one photomask is used to produce the correlation table, the only one photomask including a plurality of regions with the same critical dimension but different open ratios and the regions being selectively screened in use to make different wafer coverage ratios.

17. The method of claim 15, wherein a plurality of photomasks having the same critical dimension but different open ratios are used to produce the correlation table.

* * * * *